(12) United States Patent
Li et al.

(10) Patent No.: US 7,619,055 B2
(45) Date of Patent: *Nov. 17, 2009

(54) LINKED ARYLAMINE POLYMERS AND ELECTRONIC DEVICES GENERATED THEREFROM

(75) Inventors: Yuning Li, Mississauga (CA); Beng S. Ong, Mississauga (CA); Yiliang Wu, Mississauga (CA); Ping Liu, Mississauga (CA)

(73) Assignee: Xerox Corporation, Norwalk, CT (US)

( * ) Notice: Subject to any disclaimer, the term of this patent is extended or adjusted under 35 U.S.C. 154(b) by 114 days.

This patent is subject to a terminal disclaimer.

(21) Appl. No.: 11/399,092

(22) Filed: Apr. 6, 2006

(65) Prior Publication Data

US 2007/0235723 A1     Oct. 11, 2007

(51) Int. Cl.
*C08G 75/00*     (2006.01)
(52) U.S. Cl. ........................ 528/373; 528/377; 528/363; 528/364; 528/422; 528/423
(58) Field of Classification Search .................. 528/377, 528/363, 364, 422, 423, 8
See application file for complete search history.

(56) References Cited

U.S. PATENT DOCUMENTS

| | | | |
|---|---|---|---|
| 5,619,357 A | 4/1997 | Angelopoulos et al. | |
| 5,777,070 A | 7/1998 | Inbasekaran et al. | |
| 5,969,376 A | 10/1999 | Bao | |
| 6,107,117 A | 8/2000 | Bao et al. | |
| 6,150,191 A | 11/2000 | Bao | |
| 6,770,904 B2 | 8/2004 | Ong et al. | |
| 2004/0127666 A1* | 7/2004 | Inbasekaran et al. | 528/8 |
| 2005/0017311 A1 | 1/2005 | Ong et al. | |

FOREIGN PATENT DOCUMENTS

JP    2000-328052    * 11/2000
JP    2002069161       3/2002

OTHER PUBLICATIONS

Tu et al "Synthesis and properties of PPP-based copolymers containing phenothiazine moiety", Synthetic metals, 137(2003) pp. 1117-1118.*
Encylcopedia of Pol. Sci, Light emiting diodes, vol. 3 p. 87-100, 2001, Wiley interscience.*
See the "Cross Reference to Related Applications" on pp. 1 and 2 of the Specification Being Filed Concurrently.
Ong, Beng, et al., U.S. Appl. No. 11/011,678, filed Dec. 14, 2004 on Compound with Indolocarbazole Moieties and Devices Containing Such Compound.
Ong, Beng, et al., U.S. Appl. No. 11/167,512, filed Jun. 27, 2005 on Compound with Indolocarbazole Moieties and Devices Containing Such Compound.
Huang, D.H., et al., "Conjugated Polymers Based on Phenothiazine and Fluorene in Light-Emitting Diodes and Field Effect Transistors", *Chem. Mater.* 2004, 16, 1298-1303.
Zhu, Y., et al, "Phenoxazine-Based Conjugated Polymers: A New Class of Organic Semiconductors for Field-Effect Transistors", *Macromolecules* 2005, 38, 7983-7991.

* cited by examiner

*Primary Examiner*—David Wu
*Assistant Examiner*—Gregory Listvoyb
(74) *Attorney, Agent, or Firm*—Fay Sharpe LLP

(57) ABSTRACT

An electronic device like a thin film transistor containing an arylamine polymer of the formula

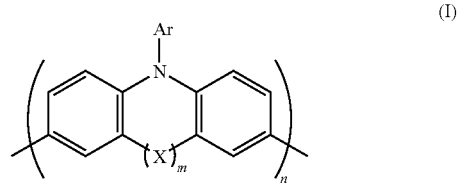

(I)

wherein Ar is aryl or heteroaryl; X represents $CH_2$, sulfur, oxygen, selenium, NR', or $SiR''_2$ wherein R' and R" are each a suitable hydrocarbon; m represents the number of X substituents; and n represents the number of repeating units.

6 Claims, 2 Drawing Sheets

LINKED ARYLAMINE POLYMERS AND ELECTRONIC DEVICES GENERATED THEREFROM

STATEMENT REGARDING FEDERALLY SPONSORED RESEARCH OR DEVELOPMENT

The electronic devices and certain components thereof were supported by a United States Government Cooperative Agreement No. 70NANBOH3033 awarded by the National Institute of Standards and Technology (NIST). The United States Government has certain rights relating to the devices and certain semiconductor components illustrated hereinafter.

CROSS-REFERENCE TO RELATED APPLICATIONS

U.S. application Ser. No. 11/398,981, filed concurrently herewith, on Functionalized Heteroacenes and Electronic Devices Generated Therefrom, by Yuning Li et al.

U.S. application Ser. No. 11/399,226, filed concurrently herewith, on Functionalized Heteroacenes, by Yuning Li et al.

U.S. application Ser. No. 11/399,216, filed concurrently herewith, on Polyacenes and Electronic Devices Generated Therefrom, by Yuning Li et al.

U.S. application Ser. No. 11/399,064, filed concurrently herewith, on Heteroacene Polymers and Electronic Devices Generated Therefrom, by Yuning Li et al.

U.S. application Ser. No. 11/399,169, filed concurrently herewith, on Ethynylene Acene Polymers and Electronic Devices Generated Therefrom, by Yuning Li et al.

U.S. application Ser. No. 11/399,091, filed concurrently herewith, on Ethynylene Acene Polymers, by Yuning Li et al.

U.S. application Ser. No. 11/399,231, filed concurrently herewith, on Poly[bis(ethynyl)heteroacenes] and Electronic Devices Generated Therefrom, by Yuning Li et al.

U.S. application Ser. No. 11/399,141, filed concurrently herewith, on Semiconductors and Electronic Devices Generated Therefrom, by Yiliang Wu et al.

U.S. application Ser. No. 11/399,230, filed concurrently herewith, on Semiconductor Polymers, by Yiliang Wu et al.

U.S. application Ser. No. 11/398,841, filed concurrently herewith, on Polydiazaacenes and Electronic Devices Generated Therefrom, by Yiliang Wu et al.

U.S. application Ser. No. 11/398,902, filed concurrently herewith, on Polydiazaacenes, by Yiliang Wu et al.

U.S. application Ser. No. 11/398,931, filed concurrently herewith, on Poly(alkynylthiophene)s and Electronic Devices Generated Therefrom, by Beng S. Ong et al.

U.S. application Ser. No. 11/399,246, filed concurrently herewith, on Poly(alkynylthiophene)s, by Beng S. Ong et al.

U.S. application Ser. No. 11/399,065, filed concurrently herewith, on Linked Arylamine Polymers, by Yuning Li et al.

Illustrated in U.S. application Ser. No. 11/011,678 filed Dec. 14, 2004 relating to indolocarbazole moieties and thin film transistor devices thereof.

Illustrated in U.S. application Ser. No. 11/167,512 filed Jun. 27, 2005 relating to indolocarbazole moieties and thin film transistor devices thereof.

Illustrated in U.S. Pat. No. 6,770,904 and copending application U.S. application Ser. No. 10/922,662, Publication No. 20050017311, are electronic devices, such as thin film transistors containing semiconductor layers of, for example, polythiophenes.

The disclosure of each of the above cross referenced applications and patent is totally incorporated herein by reference.

In aspects of the present disclosure, there may be selected the appropriate substituents, such as a suitable hydrocarbon, a heteroatom containing group, hydrogen, halogen, CN, $NO_2$, rings, number of repeating polymer units, number of groups, and the like as illustrated in the copending applications.

The appropriate components, processes thereof and uses thereof illustrated in these copending applications and the above patent may be selected for the present invention in embodiments thereof.

BACKGROUND

The present disclosure is generally directed to linked arylamine polymers and uses thereof. More specifically, the present disclosure in embodiments is directed to a class of linked arylamine polymers selected as solution processable and substantially stable channel semiconductors in organic electronic devices, such as thin film transistors. The arylamine polymers have an increased coplanarity for the polymer backbone, and thus are believed to possess high crystallinity characteristics, which crystallinity or molecular ordering permits, for example, excellent charge carrier mobility, and also these polymers are believed to be stable when exposed to oxygen. Accordingly, the linked arylamine polymers disclosed herein can be selected as p-channel semiconductors for organic thin film transistor circuits.

There are desired electronic devices, such as thin film transistors, TFTs, fabricated with substantially stable linked arylamine polymers with excellent solvent solubility, which can be solution processable; and which devices possess high crystallinity, mechanical durability and structural flexibility, characteristics which are useful for fabricating flexible TFTs on plastic substrates. Flexible TFTs enable the design of electronic devices with structural flexibility and mechanical durability characteristics. The use of plastic substrates together with the linked arylamine polymers component can transform the traditionally rigid silicon TFT into a mechanically more durable and structurally flexible TFT design. This can be of particular value to large area devices, such as large-area image sensors, electronic paper and other display media. Also, the selection of linked arylamine polymer TFTs for integrated circuit logic elements for low end microelectronics, such as smart cards, radio frequency identification (RFID) tags, and memory/storage devices, may enhance their mechanical durability, and thus their useful life span.

A number of semiconductor materials are not, it is believed, stable when exposed to air as they become oxidatively doped by ambient oxygen resulting in increased conductivity. This results in a large off-current and thus low current on/off ratio for the devices fabricated from these materials. Accordingly, with many of these materials, rigorous precautions are usually undertaken during materials processing and device fabrication to exclude environmental oxygen to avoid or minimize oxidative doping. These precautionary measures increase the cost of manufacturing thereby offsetting the appeal of certain semiconductor TFTs as an economical alternative to amorphous silicon technology, particularly for large area devices. Also, certain known stable in air aryl amine transport molecules have a low or poor crystallinity resulting in low field effect mobilities when such components are selected for organic thin film transistors. These and other disadvantages are avoided or minimized in embodiments of the present disclosure.

REFERENCES

Regioregular polythiophenes, when selected as the semiconductor layer for thin film transistors (TFT), are sensitive to air and unstable when exposed to oxygen, that is for example, when exposed to photoinduced oxidative doping in air, a disadvantage avoided or minimized with the thin film transistors disclosed herein.

Acenes, such as pentacenes and heteroacenes, are known to possess acceptable high field effect mobility when used as channel semiconductors in TFTs. However, these materials are rapidly oxidized by, for example, atmospheric oxygen under light, and such components are not considered processable at ambient conditions. Furthermore, when selected for TFTs acenes have poor thin film formation characteristics and are substantially insoluble, thus they are essentially nonsolution processable; accordingly, such components have been mostly processed by vacuum deposition methods that results in high production costs, eliminated or minimized with the TFTs generated with the functionalized heterocenes illustrated herein.

A number of organic semiconductor materials has been described for use in field-effect TFTs, which materials include organic small molecules, such as pentacene, see for example D. J. Gundlach et al., "Pentacene organic thin film transistors—molecular ordering and mobility", *IEEE Electron Device Lett.*, Vol. 18, p. 87 (1997); oligomers, such as sexithiophenes or their variants, see for example reference F. Garnier et al., "Molecular engineering of organic semiconductors: Design of self-assembly properties in conjugated thiophene oligomers", *J. Amer. Chem. Soc.*, Vol. 115, p. 8716 (1993), and poly(3-alkylthiophene), see for example reference Z. Bao et al., "Soluble and processable regioregular poly(3-hexylthiophene) for field-effect thin film transistor application with high mobility", *Appl. Phys. Lett.* Vol. 69, p 4108 (1996). Although organic material based TFTs generally provide lower performance characteristics than their conventional silicon counterparts, such as silicon crystals or polysilicon TFTs, they may nonetheless be sufficiently useful for applications in areas where high mobility is not required.

Also, a number of known small molecule or oligomer-based TFT devices rely on difficult vacuum deposition techniques for fabrication. Vacuum deposition is selected primarily because these materials are either insoluble or their solution processing by spin coating, solution casting, or stamp printing does not generally provide uniform thin films.

Further, vacuum deposition may also involve the difficulties of achieving consistent thin film quality for large area format. Polymer TFTs, such as those fabricated from regioregular components of, for example, regioregular poly(alkylthiophene-2,5-diyl) by solution processes, while offering some mobility, suffer from their propensity towards oxidative doping in air. The TFTs fabricated from these materials in ambient conditions generally, it is believed, exhibit large off-current, very low current on/off ratios, and their performance characteristics degrade rapidly. For low cost TFT design with excellent characteristics, it is therefore of value to have a semiconductor material that is both stable and solution processable, and where its performance is not adversely affected by ambient oxygen, for example, TFTs generated with the arylamine polymers illustrated herein.

Illustrated in Huang, D. H., et al, *Chem. Mater.* 2004, 16, 1298-1303, are, for example, LEDS and field effect transistors based on certain phenothiaazines like poly(10-(2-ethylhexyl)phenothiaazine).

Illustrated in Zhu, Y., et al, *Macromolecules* 2005, 38, 7983-7991, are, for example, semiconductors based on phenoxazine conjugated polymers like poly(10-hexylphenoxazine).

Additional references that may be of interest include U.S. Pat. Nos. 6,150,191; 6,107,117; 5,969,376; 5,619,357, and 5,777,070.

BRIEF DESCRIPTION OF THE DRAWINGS

Illustrated in FIGS. 1 to 4 are various representative embodiments of the present disclosure, and wherein linked arylamine polymers, such as a poly(10-(4-octylphenyl)phenothiazine) or a poly(10(4-decyloxyphenyl)phenothiazine), are selected as the channel or semiconductor material in thin film transistor (TFT) configurations.

DESCRIPTION OF THE EXEMPLARY EMBODIMENTS

Figure 1:
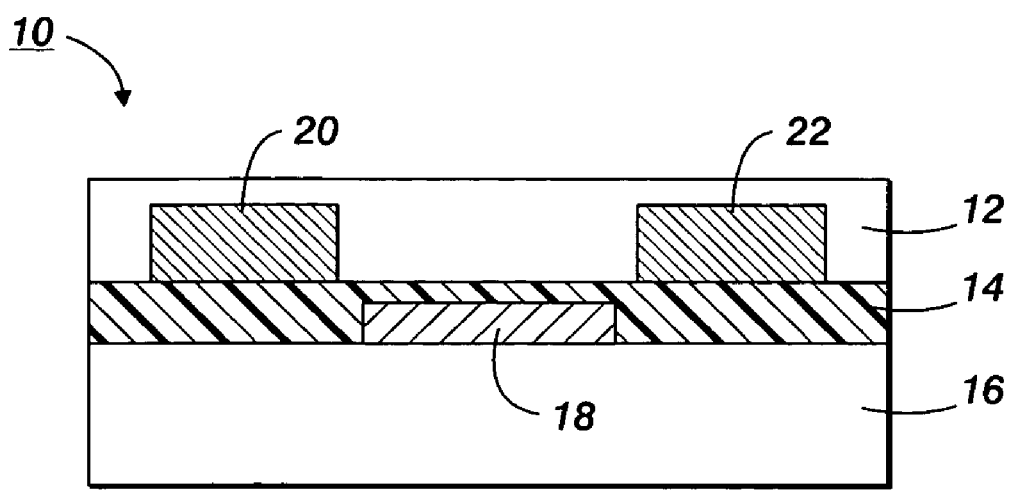

It is a feature of the present disclosure to provide a semiconductor, linked arylamine polymer, which is useful for microelectronic device applications, such as TFT devices.

It is another feature of the present disclosure to provide linked arylamine polymers with a suitable band gap of from about 2 eV to about 4 eV (electron volts), and more specifically, from about 1.5 to about 3.5 as determined from the absorption spectra of thin films thereof, and which linked arylamine polymers are suitable for use as TFT semiconductor channel layer materials.

In yet a further feature of the present disclosure there are provided linked arylamine polymers, which can be selected as microelectronic components, and which linked arylamine polymers possess excellent solubility in common organic solvents, such as methylene chloride, tetrahydrofuran, toluene, xylene, mesitylene, chlorobenzene, and the like, and thus these components can be economically fabricated by solution processes such as spin coating, screen printing, stamp printing, dip coating, solution casting, jet printing, and the like.

Also, in yet another feature of the present disclosure there are provided novel linked arylamine polymers, and devices thereof, and which devices exhibit enhanced resistance to the adverse effects of oxygen, and wherein the arylamines possess a plurality of N-aryl rings, such as two N-aryl rings, linked with S, O, C, Si, and the like with these devices exhibiting relatively high current on/off ratios, and their performance does not substantially degrade as rapidly as similar devices fabricated with regioregular poly(3-alkylthiophene-3,5-diyl) or with acenes.

Additionally, in a further feature of the present disclosure there is provided a class of novel high crystalline linked arylamine polymers with unique structural features which are conducive to molecular self-alignment under appropriate processing conditions, and which structural features also enhance the stability of device performance. Proper molecular alignment can permit higher molecular structural order in thin films, which can be important for efficient charge carrier transport, and thus excellent electrical performance.

More specifically, the present disclosure relates to linked arylamine polymers illustrated by or encompassed by Formula (I)

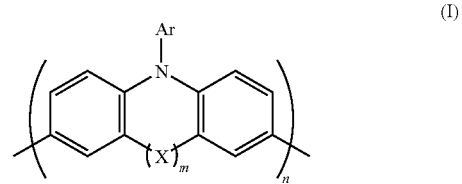

(I)

and more specifically, wherein m represents the number of X components, and can be a number of from 1 to about 5; and n is the degree of polymerization, and can be a number of about equal to or greater than 2, such as from about 2 to about 5,000, from about 100 to about 500, or from about 10 to about 20, or from about 20 to about 100; and X represents a suitable component like a heteroatom, a heteroatom containing group, a suitable hydrocarbon, NR' or SiR" wherein R' and R" represent suitable components like a hydrocarbon.
In embodiments, examples of linked arylamine polymers are represented by the following formulas wherein
(1)
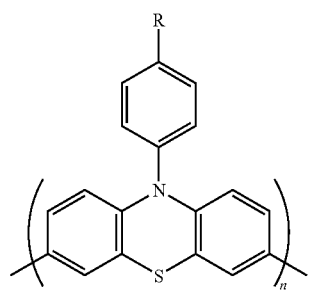
(2)
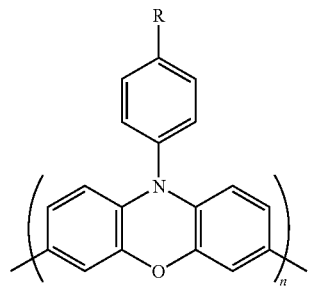
(3)
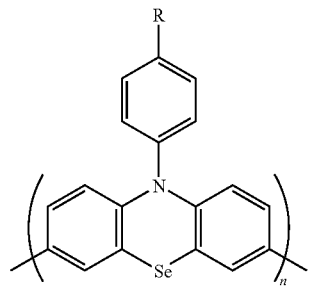
(4)
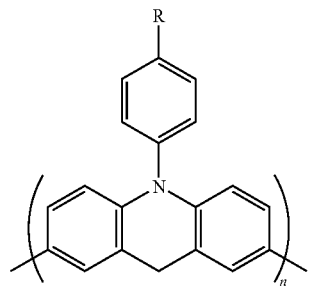
(5)
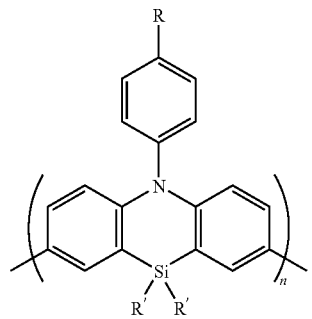
-continued
(6)
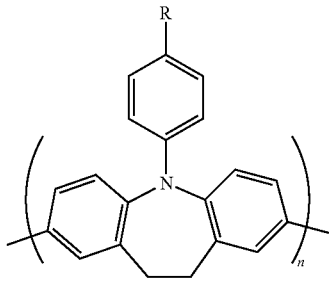
(7)
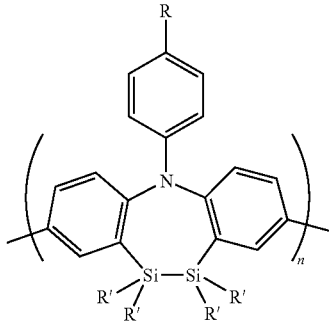
(8)
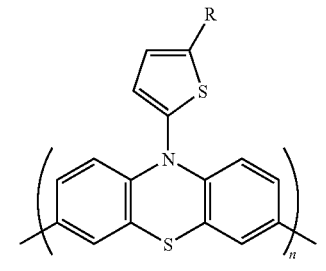
(9)
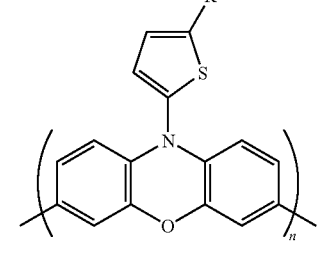
(10)
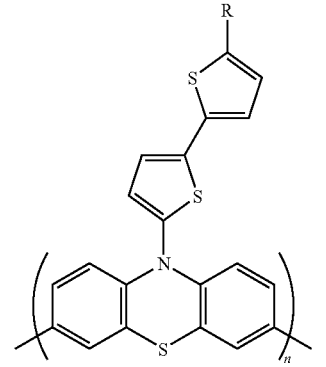

-continued
(11)
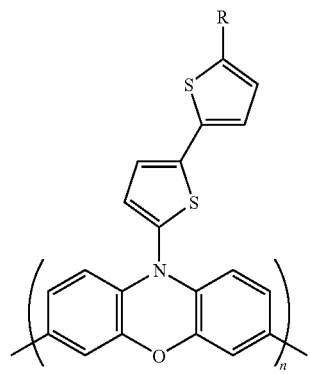
(12)
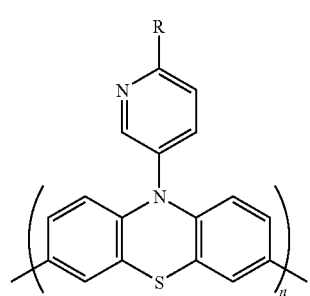
(13)
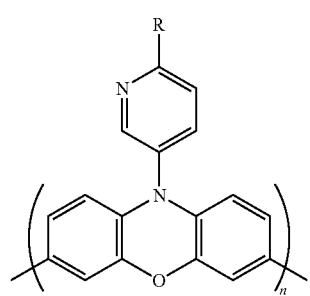
(14)
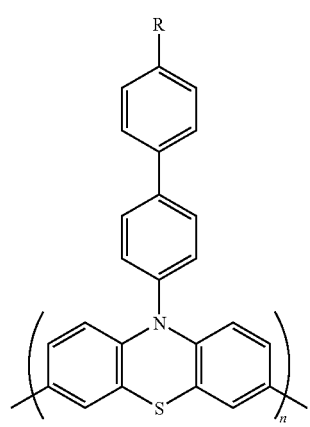
-continued
(15)
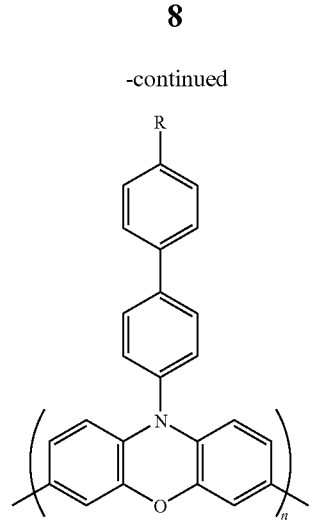
(16)
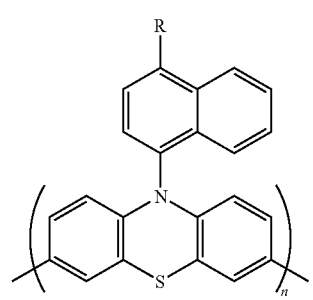
(17)
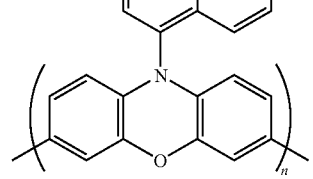
(18)
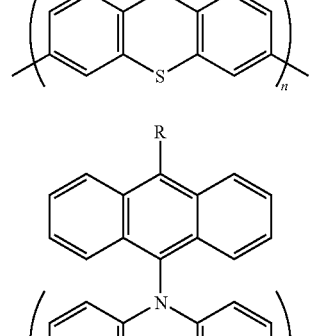
(19)

wherein R and R' are a suitable hydrocarbon like alkyl or aryl; and n represents a number of from about 2 to about 5,000.

In embodiments there are disclosed processes for the preparation of linked arylamine polymers in accordance, for example, with the following reaction scheme (Scheme 1), and more specifically, wherein there is selected as a monomer reactant phenothiazine (X is a sulfur atom and m is equal to 1) to prepare poly(10-(4-substituted phenyl)phenothiazine) (1), such as poly(10-(4-octylphenyl)phenothiazine) (1a) and poly (10-(4-decyloxyphenyl)phenothiazine) (1b). More specifically, 10-(4-octylphenyl)phenothiazine and 10-(4-decyloxyphenyl)phenothiazine can be prepared by reacting phenothiazine (available from Aldrich Chemicals) with 1-iodo-4-octylbenzene and 1-decyloxy-4-iodobenzene, respectively, with copper in the presence of catalytic amount of 18-crown-6 ether (18-C-6) in refluxing 1,2-dichlorobenzene. Thereafter, 3,7-dibromo-10-(4-octylphenyl)phenothiazine and 3,7-dibromo-10-(4-decyloxyphenyl)phenothiazine are prepared via bromination of 10-(4-octylphenyl)phenothiazine and 10-(4-decyloxyphenyl)phenothiazine, respectively, with 2 molar equivalents of N-bromosuccinimide (NBS) in N,N-dimethylformamide (DMF) at room temperature (20° C. to 25° C.). Polymerization of 3,7-dibromo-10-(4-octylphenyl)phenothiazine or 3,7-dibromo-10-(4-decyloxyphenyl)phenothiazine using zinc in the presence of nickel (II) chloride (NiCl$_2$), triphenylphosphine (PPh$_3$), and 2,2'-dipyridil in N,N-dimethylacetamide at elevated temperatures, such as 80° C., produces poly(10-(4-octylphenyl)phenothiazine) (1a) or poly(10-(4-decyloxyphenyl)phenothiazine) (1b) respectfully.

Scheme 1 - Synthesis of Linked Arylamine Polymers

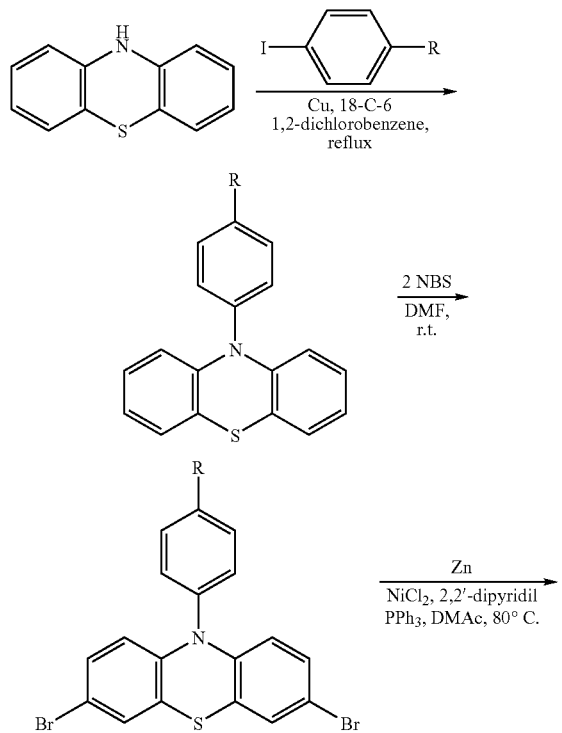

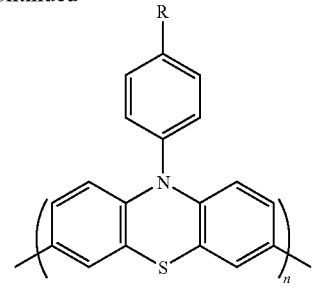

R: —C$_8$H$_{17}$ (1a)
—OC$_{10}$H$_{21}$ (1b)

Aryl examples include those components containing from about 6 to about 50, from about 6 to about 36, or from about 6 to about 18 carbon atoms. Illustrative examples of aryl are phenyl, naphthyl, anthryl, and the like, which aryls, including those not specifically recited, can be substituted with a number of suitable known groups, such as a hydrocarbon like alkyl, a hetero containing group, halogen, and the like.

Specific heteroatom containing groups are known and include, for example, polyethers, trialkylsilyls, heteroaryls, and the like; and more specifically, thienyl, furyl and pyridiaryl. The hetero component can be selected from a number of known atoms like sulfur, oxygen, nitrogen, silicon, selenium, and the like. Examples of heteroatoms or heteroatom containing components, including heteroaryls, are CN, thiazolyl, thienyl, furyl, pyridyl, trimethylsilyl, triethylsilyl, tripropylsilyl, tributylsilyl, tripentylsilyl, trihexylsilyl, triphenylsilyl, tritolylsilyl, tri(ethylphenyl)silyl, tri(propylphenyl)silyl, tri (butylphenyl)silyl, tri(pentylphenyl)silyl, tri(hexylphenyl)silyl, tri(heptylphenyl)silyl, tri(octylphenyl)silyl, tri(nonylphenyl)silyl, tri(decylphenyl)silyl, tri(dodecylphenyl)silyl, isomeric forms thereof, and mixtures thereof.

Examples of hydrocarbons, which can contain from 1 to about 50, from 1 to about 36, and for aryl from 6 to about 48 carbon atoms, include alkyl, aryl as illustrated herein, and the like, including substituted hydrocarbons of, for example, substituted alkyls and substituted aryls.

Examples of R and R' include hydrogen, alkyl with, for example, from about 1 to about 30, including from about 1 to about 12 carbon atoms (included throughout are numbers within the range, for example 4, 5, 6, 7, 8, 9, 10, 11, 12, 13, 14, 15, 16, 17 and 18), such as butyl, pentyl, hexyl, heptyl, octyl, nonyl, decyl, undecyl, dodecyl, tridecyl, tetradecyl, pentadecyl, hexadecyl, heptadecyl, octadecyl, nonadecyl, or eicosanyl, and the like; aryl with from about 6 to about 48 carbon atoms, from about 6 to about 36 carbon atoms, from about 6 to about 24 carbon atoms, such as thienyl, phenyl, methylphenyl (tolyl), ethylphenyl, propylphenyl, butylphenyl, pentylphenyl, hexylphenyl, heptylphenyl, octylphenyl, nonylphenyl, decylphenyl, undecylphenyl, dodecylphenyl, tridecylphenyl, tetradecylphenyl, pentadecylphenyl, hexadecylphenyl, heptadecylphenyl, or octadecylphenyl, and the like; and substituted alkyls and substituted aryls.

Aspects of the present disclosure relate to an electronic device containing linked arylamine polymers; a device which is a thin film transistor comprised of a substrate, a gate electrode, a gate dielectric layer, a source electrode and a drain electrode, and in contact with the source/drain electrodes and the gate dielectric layer, a semiconductor layer comprised of linked arylamine polymers illustrated herein; an electronic device comprising a semiconductive material containing a linked arylamine polymer of Formula (I)

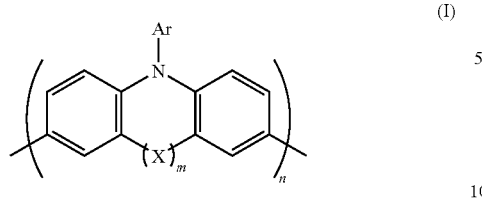
(I)

wherein Ar is aryl or heteroaryl; X represents $CH_2$, sulfur, oxygen, selenium, NR', or $SiR''_2$ wherein R' and R" are each a suitable hydrocarbon; m represents the number of X substituents; and n represents the number of repeating units; a device wherein said heteroaryl is thienyl, furanyl, pyridinyl, oxazoyl, pyrroyl, triazinyl, imidazoyl, pyrimidinyl, pyrazinyl, oxadiazoyl, pyrazoyl, triazoyl, thiazoyl, thiadiazoyl, quinolinyl, quinazolinyl, naphthyridinyl, carbazoyl, optionally substituted by at least one group of a hydrocarbon with 1 to about 36 carbon atoms, a hetero containing group with one to about 36 carbon atoms, or a halogen; a device wherein said heteroaryl is thienyl, furanyl, pyridinyl, oxazoyl, pyrroyl, triazinyl, imidazoyl, pyrimidinyl, pyrazinyl, oxadiazoyl, pyrazoyl, triazoyl, thiazoyl, thiadiazoyl, quinolinyl, quinazolinyl, naphthyridinyl, carbazoyl, optionally substituted with at least one hydrocarbon group, and wherein the hydrocarbon is an aryl of phenyl, methylphenyl (tolyl), ethylphenyl, propylphenyl, butylphenyl, pentylphenyl, hexylphenyl, heptylphenyl, octylphenyl, nonylphenyl, decylphenyl, undecylphenyl, dodecylphenyl, tridecylphenyl, tetradecylphenyl, pentadecylphenyl, heptadecylphenyl, or octadecylphenyl; a thin film transistor comprised of a substrate, a gate electrode, a gate dielectric layer, a source electrode and a drain electrode, and in contact with the source/drain electrodes and the gate dielectric layer a semiconductor layer comprised of a linked arylamine polymer of the formula

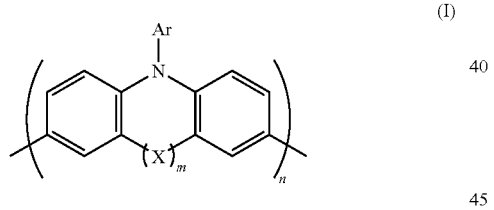
(I)

wherein Ar is a suitable hydrocarbon; X represents $CH_2$, sulfur, oxygen, selenium, NR', or $SiR''_2$ wherein R' and R" are each a suitable hydrocarbon; m represents the number of X substituents; and n represents the number of the repeating units; an electronic device comprising a semiconductive material containing a linked arylamine polymer, and wherein said device is a thin film transistor and said linked arylamine polymer is selected from the group consisting of those of Formulas (1) through (19)

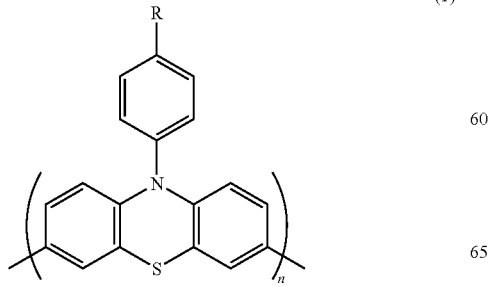
(1)

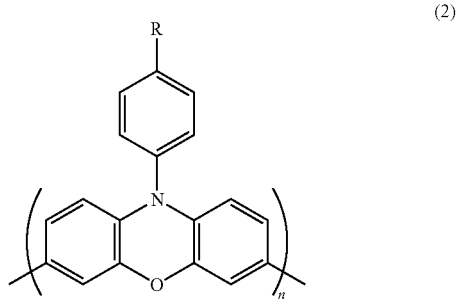
(2)

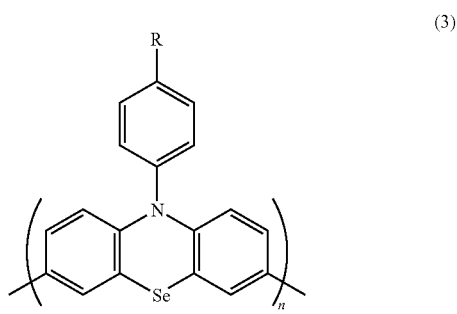
(3)

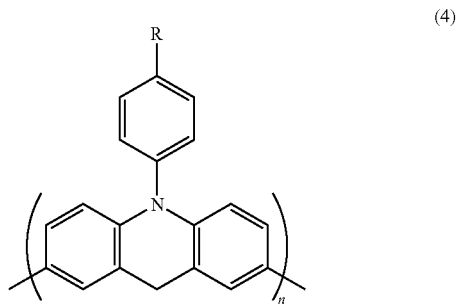
(4)

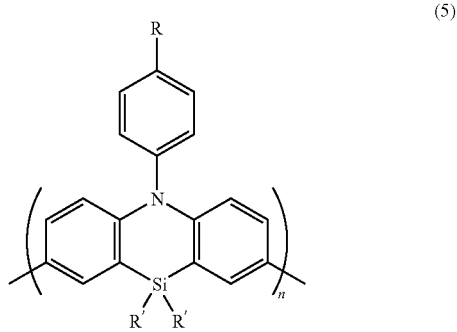
(5)

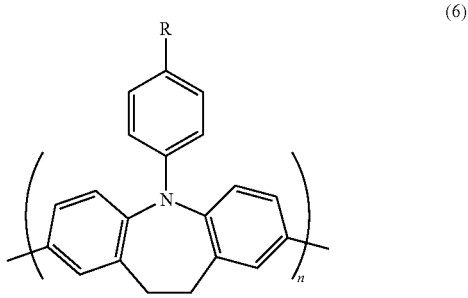
(6)

-continued
(7)
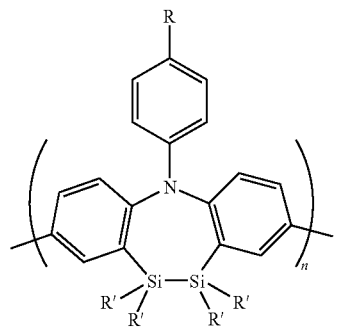
(8)
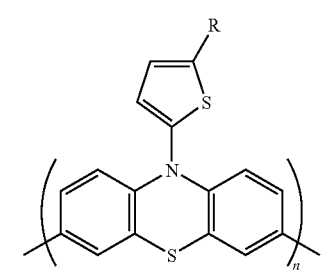
(9)
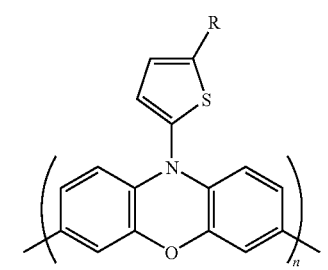
(10)
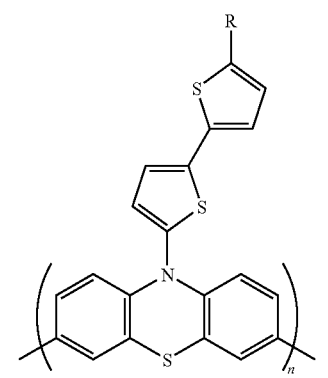
(11)
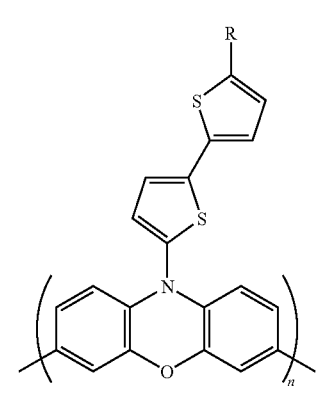
-continued
(12)
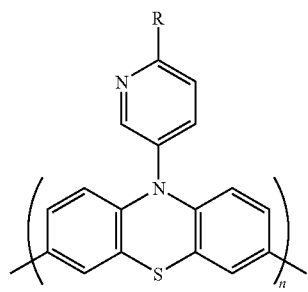
(13)
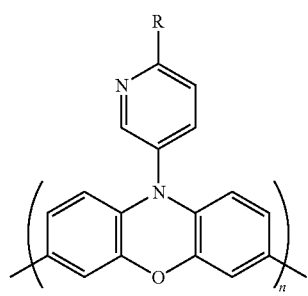
(14)
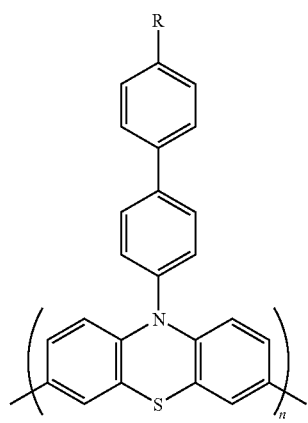
(15)
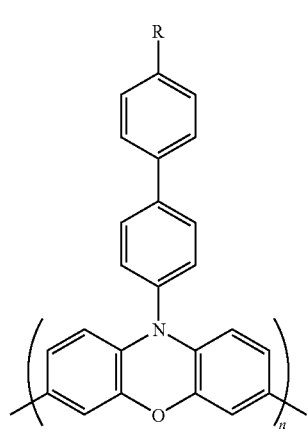

-continued

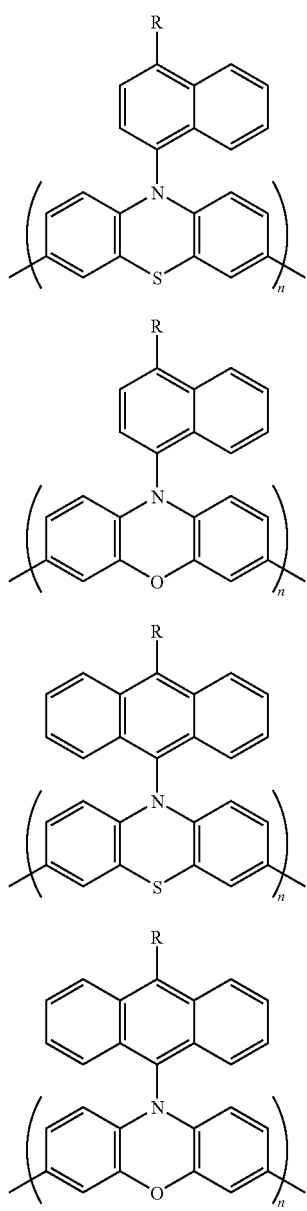

wherein R is alkyl or aryl of methyl, ethyl, propyl, butyl, pentyl, hexyl, heptyl, octyl, nonyl, decyl, undecyl, dodecyl, tridecyl, tetradecyl, pentadecyl, hexadecyl, heptadecyl, or octadecyl; and wherein n is the number of repeat units in the polymer of from about 2 to about 5,000; a polymer of the following formula

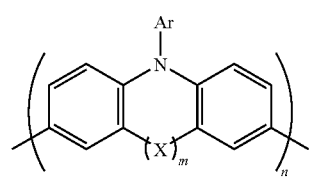

wherein Ar is aryl or heteroaryl; X represents $CH_2$, sulfur, oxygen, selenium, NR', or $SiR''_2$ wherein R' and R'' are each a suitable hydrocarbon; m represents the number of X substituents; and n represents the number of the repeating units; an electronic device, such as thin film transistors containing a layer of linked aryl polymers of

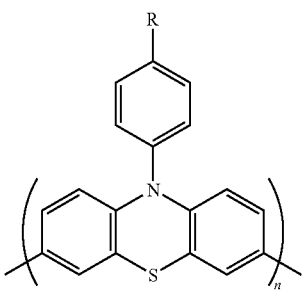

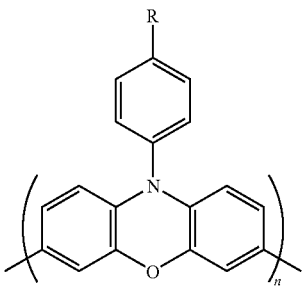

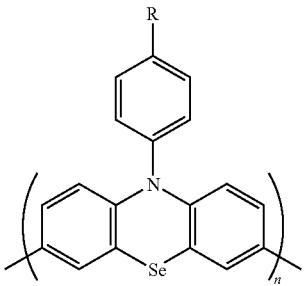

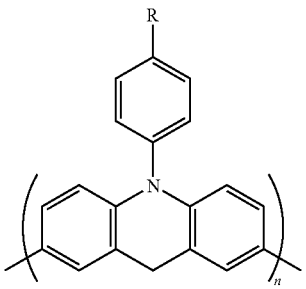

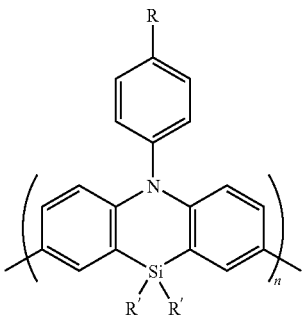

-continued

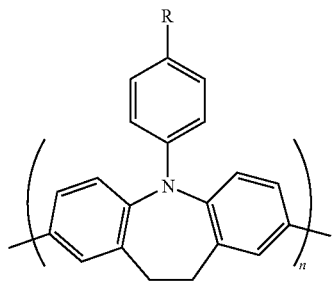
(6)

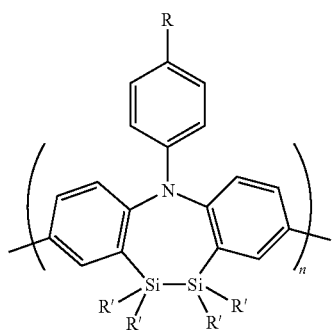
(7)

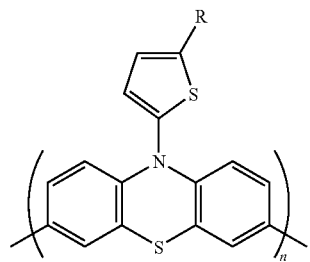
(8)

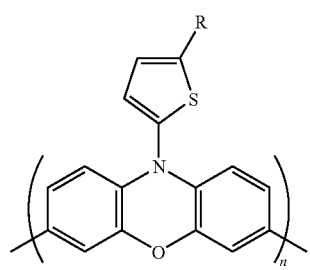
(9)

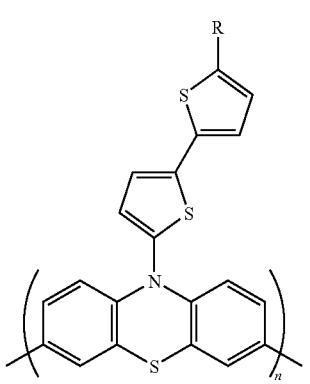
(10)

-continued

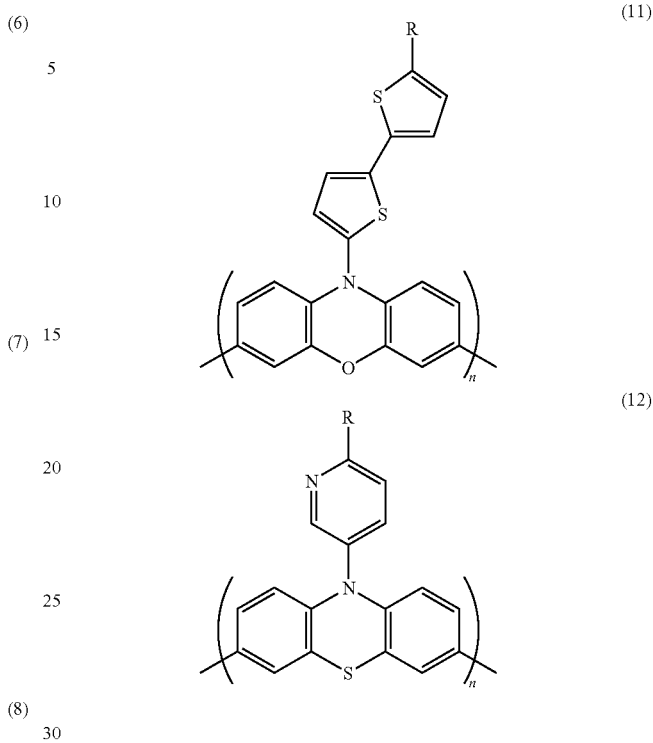

wherein R is alkylaryl and the like, R' and R" is alkyl or aryl and the like; and n represents the number of repeating polymer units; a TFT device wherein the substrate is a plastic sheet of a polyester, a polycarbonate, or a polyimide; the gate source and drain electrodes are each independently comprised of gold, nickel, aluminum, platinum, indium titanium oxide, or a conductive polymer, and the gate dielectric is a dielectric layer comprised of silicon nitride or silicon oxide; a TFT device wherein the substrate is glass or a plastic sheet; said gate, source and drain electrodes are each comprised of gold, and the gate dielectric layer is comprised of the organic polymer poly(methacrylate), or poly(vinyl phenol); a device wherein the poly(3-alkynylthiophene) layer is formed by solution processes of spin coating, stamp printing, screen printing, or jet printing; a device wherein the gate, source and drain electrodes, the gate dielectric, and semiconductor layers are formed by solution processes of spin coating, solution casting, stamp printing, screen printing, or jet printing; and a TFT device wherein the substrate is a plastic sheet of a polyester, a polycarbonate, or a polyimide, and the gate, source and drain electrodes are fabricated from the organic conductive polymer polystyrene sulfonate-doped poly(3,4-ethylene dioxythiophene) or from a conductive ink/paste compound of a colloidal dispersion of silver in a polymer binder, and the gate dielectric layer is organic polymer or inorganic oxide particle-polymer composite; device or devices include electronic devices such as TFTs.

DETAILED DESCRIPTION OF THE FIGURES

In FIG. 1 there is schematically illustrated a TFT configuration 10 comprised of a substrate 16, in contact therewith a metal contact 18 (gate electrode), and a layer of an insulating dielectric layer 14 with the gate electrode having a portion thereof or the entire gate in contact with the dielectric layer 14 with the gate electrode having a portion thereof or the entire gate in contact with the dielectric layer 14 on top of which layer 14 two metal contacts, 20 and 22 (source and drain electrodes), are deposited. Over and between the metal contacts 20 and 22 is the linked arylamine polymer of poly(10-(4-octylphenyl)phenothiazine) (1a) or poly(10-(4-decyloxyphenyl)phenothiazine) (1b), layer 12. The gate electrode can be included in the substrate, in the dielectric layer, and the like throughout.

Figure 2:
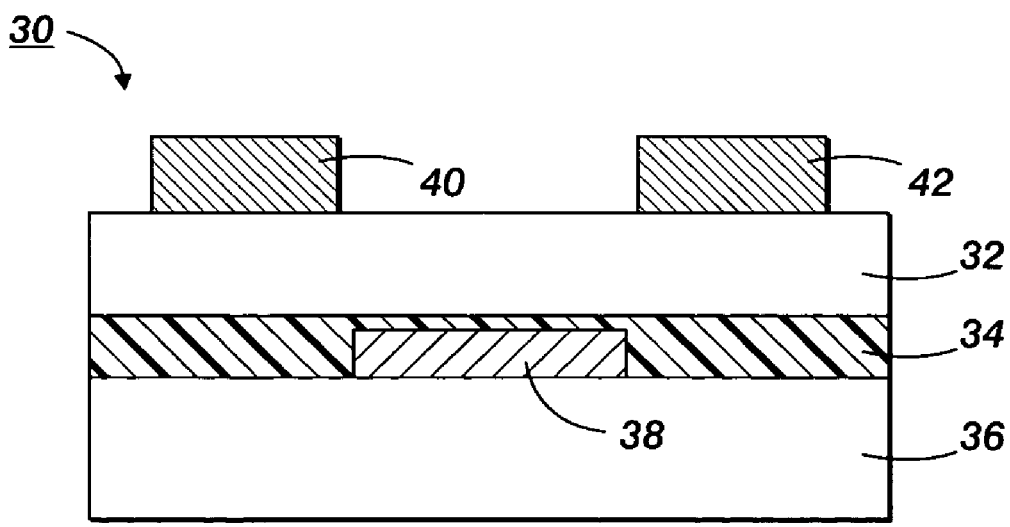

FIG. 2 schematically illustrates another TFT configuration 30 comprised of a substrate 36, a gate electrode 38, a source electrode 40, and a drain electrode 42, an insulating dielectric layer 34, and a linked arylamine polymer semiconductor layer 32.

Figure 3:
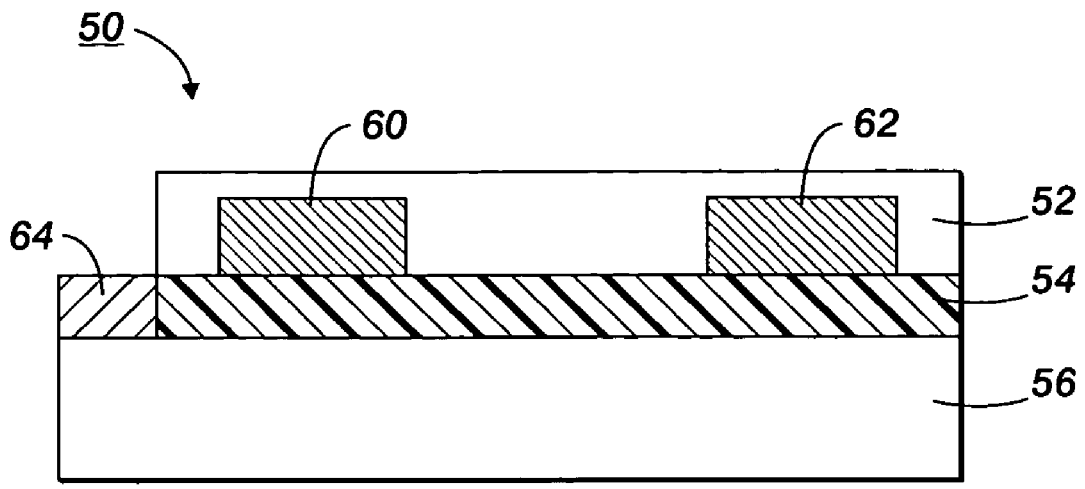

FIG. 3 schematically illustrates a further TFT configuration 50 comprised of a heavily n-doped silicon wafer 56, which can act as a gate electrode, a thermally grown silicon oxide dielectric layer 54, a linked arylamine polymer semiconductor layer 52, on top of which are deposited a source electrode 60 and a drain electrode 62; and a gate electrode contact 64.

Figure 4:
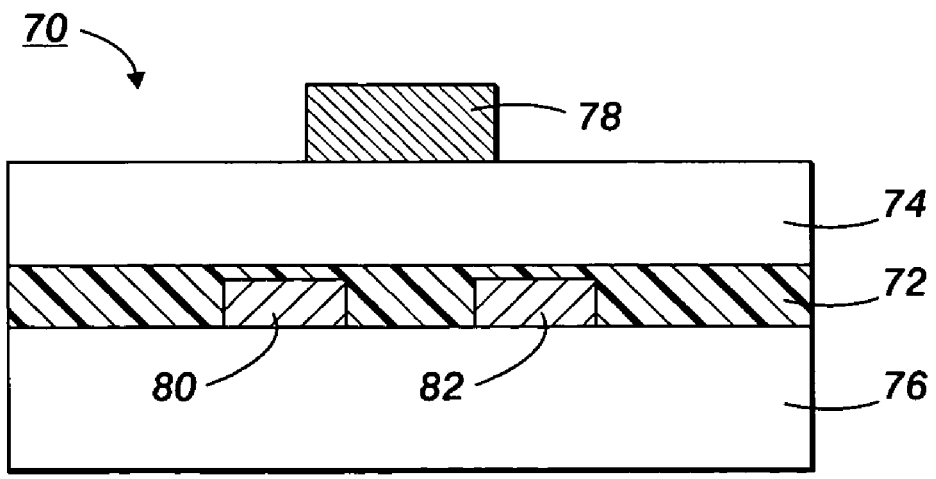

FIG. 4 schematically illustrates a TFT configuration 70 comprised of substrate 76, a gate electrode 78, a source electrode 80, a drain electrode 82, a linked arylamine polymer semiconductor layer 72, and an insulating dielectric layer 74.

In some embodiments of the present disclosure, an optional protecting layer may be incorporated on top of each of the transistor configurations of FIGS. 1, 2, 3 and 4. For the TFT configuration of FIG. 4, the insulating dielectric layer 74 may also function as a protecting layer.

In embodiments and with further reference to the present disclosure and the Figures, the substrate layer may generally be a silicon material inclusive of various appropriate forms of silicon, a glass plate, a plastic film or a sheet, and the like depending on the intended applications. For structurally flexible devices, a plastic substrate, such as for example polyester, polycarbonate, polyimide sheets, and the like, may be selected. The thickness of the substrate may be, for example, from about 10 micrometers to over 10 millimeters with a specific thickness being from about 50 to about 100 micrometers, especially for a flexible plastic substrate and from about 1 to about 10 millimeters for a rigid substrate such as glass or silicon.

The insulating dielectric layer, which can separate the gate electrode from the source and drain electrodes, and in contact with the semiconductor layer, can generally be an inorganic material film, an organic polymer film, or an organic-inorganic composite film. The thickness of the dielectric layer is, for example, from about 10 nanometers to about 1 micrometer with a more specific thickness being about 100 nanometers to about 500 nanometers. Illustrative examples of inorganic materials suitable as the dielectric layer include silicon oxide, silicon nitride, aluminum oxide, barium titanate, barium zirconate titanate, and the like; illustrative examples of organic polymers for the dielectric layer include polyesters, polycarbonates, poly(vinyl phenol), polyimides, polystyrene, poly(methacrylate)s, poly(acrylate)s, epoxy resin, and the like; and illustrative examples of inorganic-organic composite materials include nanosized metal oxide particles dispersed in polymers, such as polyester, polyimide, epoxy resin and the like. The insulating dielectric layer is generally of a thickness of from about 50 nanometers to about 500 nanometers depending on the dielectric constant of the dielectric material used. More specifically, the dielectric material has a dielectric constant of, for example, at least about 3, thus a suitable dielectric thickness of about 300 nanometers can provide a desirable capacitance, for example, of about $10^{-9}$ to about $10^{-7}$ F/cm$^2$.

Situated, for example, between and in contact with the dielectric layer and the source/drain electrodes is the active semiconductor layer comprised of the linked arylamine polymers illustrated herein, and wherein the thickness of this layer is generally, for example, about 10 nanometers to about 1 micrometer, or about 40 to about 100 nanometers. This layer can generally be fabricated by solution processes.

The gate electrode can be a thin metal film, a conducting polymer film, a conducting film generated from a conducting ink or paste, or the substrate itself (for example heavily doped silicon). Examples of gate electrode materials include, but are not limited to aluminum, gold, chromium, indium tin oxide, conducting polymers, such as polystyrene sulfonate-doped poly(3,4-ethylenedioxythiophene) (PSS/PEDOT), a conducting ink/paste comprised of carbon black/graphite or colloidal silver dispersion contained in a polymer binder, such as Electrodag available from Acheson Colloids Company, and silver filled electrically conductive thermoplastic ink available from Noelle Industries, and the like. The gate layer can be prepared by vacuum evaporation, sputtering of metals or conductive metal oxides, coating from conducting polymer solutions or conducting inks or dispersions by spin coating, casting or printing. The thickness of the gate electrode layer is, for example, from about 10 nanometers to about 10 micrometers, and a specific thickness is, for example, from about 10 to about 200 nanometers for metal films, and about 1 to about 10 micrometers for polymer conductors.

The source and drain electrode layer can be fabricated from materials which provide a low resistance ohmic contact to the semiconductor layer. Typical materials suitable for use as source and drain electrodes include those of the gate electrode materials, such as gold, nickel, aluminum, platinum, conducting polymers, and conducting inks. Typical thickness of this layer is about, for example, from about 40 nanometers to about 1 micrometer with the more specific thickness being about 100 to about 400 nanometers. The TFT devices contain a semiconductor channel with a width W and length L. The semiconductor channel width may be, for example, from about 10 micrometers to about 5 millimeters with a specific channel width being about 100 micrometers to about 1 millimeter. The semiconductor channel length may be, for example, from about 1 micrometer to about 1 millimeter with a more specific channel length being from about 5 micrometers to about 100 micrometers.

The source electrode is grounded and a bias voltage of generally, for example, about 0 volt to about −80 volts is applied to the drain electrode to collect the charge carriers transported across the semiconductor channel when a voltage of generally about +10 volts to about −80 volts is applied to the gate electrode.

Other known materials not recited herein for the various components of the TFT devices of the present disclosure can also be selected in embodiments.

The claims, as originally presented and as they may be amended, encompass variations, alternatives, modifications, improvements, equivalents, and substantial equivalents of the embodiments and teachings disclosed herein, including those that are presently unforeseen or unappreciated, and that, for example, may arise from applicants/patentees and others. Unless specifically recited in a claim, steps or components of claims should not be implied or imported from the specification or any other claims as to any particular order, number, position, size, shape, angle, color, or material.

What is claimed is:

1. An electronic device comprising a semiconductive material containing a linked arylamine dimer, trimer, tetramer, pentamer, hexamer, heptamer, or homopolymer of Formula (I):

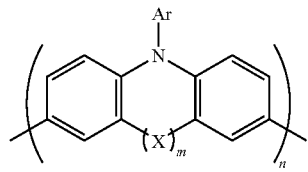

wherein Ar is 4-decyloxyphenyl; X represents sulfur; m is 1; and n represents the number of the repeating units, wherein n is 2 or greater.

2. A device in accordance with claim 1 wherein n is from 2 to about 5,000.

3. A device in accordance with claim 1 wherein n is from about 10 to about 200.

4. A device in accordance with claim 1 wherein n is from about 20 to about 100.

5. A thin film transistor comprised of a substrate, a gate electrode, a gate dielectric layer, a source electrode, and a drain electrode, and in contact with the source/drain electrodes and the gate dielectric layer a semiconductor layer comprised of a linked arylamine dimer, trimer, tetramer, pentamer, hexamer, heptamer, or homopolymer of the following formula:

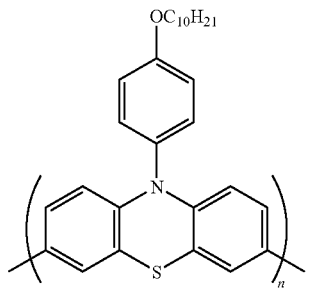

wherein n represents the number of repeating units, n being 2 or greater.

6. A thin film transistor in accordance with claim 5 wherein said substrate is a plastic sheet of polyester, a polycarbonate, or a polyimide, said gate source and drain electrodes are each independently comprised of silver, gold, nickel, aluminum, chromium, platinum, or indium titanium oxide, or a conductive polymer, and said gate dielectric layer is comprised of inorganic nitrides or oxides, or organic polymers, silicon nitride, silicon oxide; and wherein said linked arylamine dimer, trimer, tetramer, pentamer, hexamer, heptamer, or homopolymer is deposited by solution processes of spin coating, stamp printing, screen printing, or jet printing.

* * * * *

UNITED STATES PATENT AND TRADEMARK OFFICE
CERTIFICATE OF CORRECTION

PATENT NO.         : 7,619,055 B2
APPLICATION NO.    : 11/399092
DATED              : November 17, 2009
INVENTOR(S)        : Yuning Li et al.

It is certified that error appears in the above-identified patent and that said Letters Patent is hereby corrected as shown below:

In the Specification

Column 1, line 10, after "Cooperative Agreement No.", please delete "70NANBOH3033" and insert --70NANB0H3033--.

Signed and Sealed this
Third Day of September, 2013

Teresa Stanek Rea
*Acting Director of the United States Patent and Trademark Office*